United States Patent [19]

Fenk

[11] Patent Number: 4,847,567

[45] Date of Patent: Jul. 11, 1989

[54] MONOLITHICALLY INTEGRABLE, AMPLITUDE-CONTROLLABLE OSCILLATOR AMPLIFIER CIRCUIT

[75] Inventor: Josef Fenk, Eching, Fed. Rep. of Germany

[73] Assignee: Siemens Aktiengesellschaft, Munich, Fed. Rep. of Germany

[21] Appl. No.: 220,590

[22] Filed: Jul. 18, 1988

[30] Foreign Application Priority Data

Jul. 17, 1987 [DE] Fed. Rep. of Germany ....... 3723751

[51] Int. Cl.[4] .......................... H03F 3/45; H03G 3/30
[52] U.S. Cl. .................................... 330/254; 331/109; 330/279
[58] Field of Search ............... 330/252, 254, 259, 260, 330/279, 307; 331/109

[56] References Cited

U.S. PATENT DOCUMENTS

| 4,028,638 | 6/1977 | Towle | 331/109 |
| 4,479,259 | 10/1984 | Fenk | 455/318 |
| 4,588,968 | 5/1986 | Wile | 331/109 |
| 4,621,238 | 11/1986 | Fenk | 330/254 |

FOREIGN PATENT DOCUMENTS 2803430 8/1979 Fed. Rep. of Germany .
3041392 8/1984 Fed. Rep. of Germany .

OTHER PUBLICATIONS

Patent Abstracts of Japan, vol. 10, No. 309, Oct. 21, 1986, p. 27 E 447; & JP-A-61 121 504 (Matsushita Electric Ind. Co. Ltd.), 6/9/86.

Tietze Und Schenk: "Halbleiter-Schaltungstechnik", 1980, Printing 5, pp. 329–333.

Primary Examiner—Steven Mottola
Attorney, Agent, or Firm—Herbert L. Lerner; Laurence A. Greenberg

[57] ABSTRACT

A monolithically integrable amplitude-controllable oscillator amplifier circuit includes a differential amplifier having capacitors and transistors, some of which form a cascode circuit and some of which are connected to various potentials, as well as a frequency-determining circuit element connected to the oscillator amplifier, amplifier outputs providing output signals and resistors connected to the transistors. A first current source is formed of a series circuit of a second current source, a constant current source and a circuit node. A control circuit for the oscillator amplifier controls amplitude as a function of the output signal and has a control element with a first voltage-controlled current source. A controller provides an actual-value detection by rectification, an input signal mean-value suppression with a differential amplifier, and a set-point setting. The controller feeds a control variable to the first voltage-controlled current source. An operational amplifier and a low-pass filter are provided. The ratio of the current of the second constant current source to the current of the first constant current source provides set-point setting.

20 Claims, 2 Drawing Sheets

MONOLITHICALLY INTEGRABLE, AMPLITUDE-CONTROLLABLE OSCILLATOR AMPLIFIER CIRCUIT

The invention relates to a monolithically integrable, amplitude-controllable oscillator amplifier circuit, including a differential amplifier having a first transistor, a second transistor coupled to the emitter of the first, the base contact of the first transistor being connected to a frequency-determining circuit element, the base of the first transistor and the base of the second transistor being acted upon by a direct voltage, the base of the second transistor being connected through a first capacitor to a reference potential, such as ground, the frequency-determining circuit element being connected to the collector of the second transistor, the frequency-determining circuit element being connected, especially through capacitors, to the oscillator amplifier, the collector of the first transistor being connected through a circuit element to a first potential, the collector of the second transistor being connected through a circuit element to a second potential, and the emitters of the first and second transistors being connected through a first current source, especially a resistor, to the reference potential, and a controller in which an actual-value detection by means of rectification, an input signal mean-value suppression through the use of a differential amplifier, and a set-point setting, are provided.

Among the other sources, German Patent DE-PS 30 41 392 discloses amplitude-controllable oscillator amplifiers even in the form of differential amplifier assemblies with controller circuit, in which the input signals are rectified, the undesirable signal components that are not part of the control variable are eleminated by means of the common mode suppression of the differential amplifier input of an operational amplifier circuit, and set-value setting means are provided. In circuits constructed according to FIG. 1 of that German Patent, the output signal at the collectors of the two transistors of the oscillator and differential amplifier pair is symmetrically decoupled and utilized for a controller for actual-value detection, accompanied by formation of the mean value of the direct component and rectification of the high-frequency component.

However, upon variation of the collector voltages of the differential amplifier pair, a DC offset takes place in such circuits between the collector voltages of the two transistors, and this can be expressed as disturbance. Furthermore, the bandwidth of the oscillator amplifier is negatively affected by the Miller effect appearing at the first transistor and by further parasitic capacitors. In oscillator differential amplifiers of the above-mentioned type, a frequency-determining circuit element is typically disposed between the base contact of the first transistor and the collector contact of the transistor. In the oscillating circuit formed by the frequency-determining circuit element and the differential amplifier pair, the parasitic capacitances of the transistors as well as the component assemblies possibly connected to the base contacts of the transistors bring about a low-pass filter effect. The result of the Miller effect can be eliminated by means of a cascode circuit, as mentioned in the publication entitled Halbleiter-Schaltungs-technik [Semiconductor Circuit Technology] by Tietze and Schenk, fifth edition, 1980, pp. 330–333. The use of such a circuit is only possible in a modified, less effective form with symmetrical signal decoupling at the collectors of the oscillator amplifier transistors, as in the aforementioned German Patent DE-PS 30 41 392. In this case, load resistors are in fact necessary between the collector contacts of the emitter grounded transistors and the emitter contacts of the base grounded transistors, yet the load resistors prevent the elimination of the Miller effect. In the vicinity of the transistor which has a collector that is connected to the frequency-determining circuit element, the amplifier bandwidth is impaired primarily by the parasitic collector-to-base capacitance, while the other parasitic capacitances occurring in this transistor merely lead to a change in the resonant frequency.

The parasitic collector-to-base capacitance is formed by the depletion layer capacitance between the collector and base. As the voltage between the collector and emitter and therefore the depletion voltage between the collector and base become higher, the depletion layer capacitance becomes lower. At a predetermined operating voltage, if the load resistance between the collector contact and the operating voltage is not intended to drop below a predetermined, relatively high value, then the emitter contact must be connected with as little resistance as possible to the reference potential, so as to obtain as high a voltage as possible in the transistor, as a function of the current, and thus as low a parasitic capacitance as possible.

In the aforementioned German Patent, the controller has two inputs, each having a rectifier, which are provided for imposing a symmetrical output signal of a differential amplifier and for full-course rectification of this signal. The output of each rectifier is respectively connectd to one input of an operational amplifier. The output signal of the operational amplifier and thus of the control system is proportional to the differential signal of the two input signals. If the signal present at the two inputs is in the form of a symmetrically decoupled differential amplifier output signal having a push-pull alternating voltage component as well as a direct voltage component and disturbance in the form of common-mode alternating voltage components, then the common-mode components are suppressed by the controller and only the push-pull component of the input signal affects the output signal of the controller. The proportionality factor between the input differential signal and the output signal and therefore the set-point value of the controller are fixed by means of a direct voltage difference between the two inputs of the operational amplifier, especially in the circuit shown in FIG. 2 of German Patent DE-PS 30 41 392. This direct voltage difference is attained by means of additional DC operating point setting means, at least at one operational amplifier input, and these setting means typically include a plurality of resistors.

In prior art oscillator differential amplifiers, like that described in German Patent DE-PS 30 41 392, the controller output voltage of the amplitude control acts directly upon the potential of a base contact of the differential amplifier pair, and thus varies the operating point of the differential amplifier as a function of the oscillator output signal amplitude. The capacitive output impedance of the controller circuit loads the base contacts of the transistors and thus limits the bandwidth of the amplifier circuit.

Another possibility of varying the operating point of the differential amplifier is to vary the emitter currents fed to the differential amplifier transistors.

Among the disadvantages of a control circuit in accordance with the above-described prior art are the additional expense for components required in order to set the operating point at the operational amplifier inputs of the controller and the direct dependency of the actual set-point value on the constance of the operating point voltage of the operational amplifier. Furthermore, the controller circuit described in German Patent DE-PS 30 41 392 can only be suitably used for controlling differential amplifier pairs having symmetrical actual-value decoupling.

It is accordingly an object of the invention to provide a monolithically integrable, amplitude-controllable oscillator amplifier circuit, which overcomes the hereinafore-mentioned disadvantages of the heretofore-known devices of this general type and to minimize the reduction in bandwidth dictated by parasitic circuit elements, without disturbance from the additional noise power of the control loop at the output of the oscillator amplifier.

With the foregoing and other objects in view there is provided, in accordance with the invention, a monolithically integrable amplitude-controllable oscillator amplifier circuit, comprising a differential amplifier including first, second and third transistors each having an emitter contact, a collector contact and a base contact; the emitter contacts of the first and the second transistors being interconnected, a frequency-determining circuit element connected to the base contact of the first transistor, the base contacts of the first, the second and the third transistors being acted upon by a direct voltage, a first capacitor connecting the base contact of the second transistor to a reference potential, such as ground, the frequency-determining circuit element being connected to the collector contact of the second transistor, the frequency-determining circuit element being connected to the oscillator amplfier, the collector contact of the first transistor being connected directly to the emitter contact of the third transistor forming a cascode circuit, the collector contact of the third transistor being connected to a first potential, the collector contact of the second transistor forming a first amplifier output providing a first output signal, a first resistor connected between the collector contact of the second transistor and a second potential; a first current source connected between the interconnected emitter contacts of the first and the second transistors and the reference potential, the first current source being formed of a series circuit of a second current source, a seventh constant current source, such as a second resistor, and a circuit node connected between the second current source and the seventh constant current source; a control circuit for the oscillator amplifier controlling amplitude as a function of the output signal, the control circuit including a signal input, a control element having a first voltage-controlled current source with a control voltage input, a current input and a current output; a controller providing an actual-value detection by rectification, an input signal mean-value suppression with a differential amplifier, and a set-point setting, the controller feeding a control variable to the control voltage input of the first voltage-controlled current source, the current input of the first voltage-controlled current source being connected to a third potential, and the current output of the first voltage-controlled current source being connected to the first circuit node; ninth and tenth transistors each having an emitter contact, a collector contact and a base contact, an operational amplifier having two inputs and an output, the signal input of the controller circuit being connected to the base contact of the ninth transistor, a low-pass filter connected to the base contact of the tenth transistor and to the signal input, the collector contacts of the ninth and tenth transistors being connected to a potential, the emitter contact of the ninth transistor being connected to one of the inputs of the operational amplifier, a second capacitor connected between the emitter contact of the ninth transistor and reference potential, a first constant current source connected between the emitter contact of the ninth transistor and reference potential, the emitter contact of the tenth transistor being connected to the other of the inputs of the operational amplifier, a second constant current source connected between the emitter contact of the tenth transistor and the reference potential, and an output of the controller connected to the output of the operational amplifier, whereby the ratio of the current of the second constant current source to the current of the first constant current source provides set-point setting.

In accordance with another feature of the invention, there are provided capacitors connected between the frequency-determining circuit element and the oscillator amplifier.

In accordance with a further feature of the invention, the second current source is an eighth transistor having emitter, collector and base contacts, the collector contact of the eighth transistor is interconnected with the interconnected emitter contacts of the first and the second transistors, the emitter contact of the eighth transistor is connected to the first node, and the base contact of the eighth transistor is acted upon by the reference potential.

In accordance with an added feature of the invention, there are provided fourth and fifth transistors each having emitter, collector and base contacts, the first voltage-controlled current source being in the form of a parallel circuit of a second voltage-controlled current source and a third voltage-controlled current source each having a control input, a current output, a current input and the same current magnitude, the control inputs and the current outputs of the second and third voltage-controlled current sources being interconnected; the current input of the third voltage-controlled current source being connected to the third potential; the current input of the second voltage-controlled current source being connected to the first resistor; a third resistor connecting the collector contact of the fourth transistor and the base contact of the fifth transistor to be a fourth potential; the collector contact of the fifth transistor being connected to the fourth potential; the emitter contact of the fifth transistor forming a second amplifier output providing a second output signal being largely phase-coincident with the first signal output, another current source connected between the emitter contact of the fifth transistor and the reference potential; and the emitter contact of the fourth transistor being connected to the second potential.

In accordance with an additional feature of the invention, the fourth potential is identical to the first potential.

In accordance with yet another feature of the invention, the base contact of the fourth transistor is connected to the base contact of the third transistor.

In accordance with yet a further feature of the invention, the current source connected between the emitter contact of the fifth transistor and the reference potential connected is a resistor.

In accordance with yet an added feature of the invention, there is provided a fourth capacitor connecting the control input of the first voltage-controlled current source to the reference potential.

In accordance with yet an additional feature of the invention, the first constant current source is a second resistor, and including at least one other oscillator amplifier being identical to the first-mentioned oscillator amplifier, all of the oscillator amplifiers having one common operating point and direct voltage supply for the second transistors, the first capacitors, the second resistors, the first voltage-controlled current sources, the fourth capacitors, the fourth transistors and the fifth transistor, including the connections therefor.

In accordance with still another feature of the invention, the third voltage-controlled current source includes a sixth transistor having emitter, collector and base contacts and a fourth resistor connecting the emitter contact of the sixth transistor to the current output of the third voltage-controlled current source; the second voltage-controlled current source including at least a seventh transistor having emitter, collector and base contacts and at least one fifth resistor connecting the emitter contact of the at least one seventh transistor to the current outputs of the second and third voltage-controlled current sources; the base contacts of the sixth and the at least one seventh transistors are connected directly to the control inputs of the second and third voltage-controlled current sources; the collector contact of the sixth transistor forms the current input of the third voltage-controlled current source and is connected to the third potential; the collector contact of the at least one seventh transistor respectively forms the current input of the second voltage-controlled current source and is connected to the emitter contact of the fourth transistor, and the fourth transistor has a separate emitter contact connected to each collector contact of the at least one seventh transistor.

In accordance with still an added feature of the invention, the second and the third voltage-controlled current sources have current of the same magnitude.

In accordance with still an added feature of the invention, each of the fourth resistor and the at least one fifth resistor have resistance values each being greater than the resistance value of the first resistor.

In accordance with still an added feature of the invention, there is provided a third and fourth constant current sources, an eleventh transistor having emitter, collector and base contacts and being connected between the ninth transistor and the one input of the operational amplifier forming a Darlington stage, the emitter contact of ninth transistor being connected to the base contact of the eleventh transistor, the emitter contact of the eleventh transistor being connected to the one input of the operational amplifier and through the third constant current source to the reference potential; a twelfth transistor having emitter, collector and base contacts and being connected between the tenth transistor and the other input of the operational amplifier forming another Darlington stage, the emitter contact of the tenth transistor being connected to the base contact of the twelfth transistor, the emitter contact of the twelfth transistor being connected to the other input of the operational amplifier and through the fourth constant current source to the reference potential, the collector contacts of the eleventh and the twelfth transistors each being connected to a potential; whereby in addition to the ratio of the current of the first constant current source to the current of the second constant current source, the ratio of the ratios of the current of the third constant current source to the current of the first constant current source to the ratio of the current of the fourth constant current source to the current of the second constant current source provide the set-point value setting.

In accordance with still an additional feature of the invention, the potential connected to the collector contacts of the ninth and tenth transistors is a common fifth supply potential.

In accordance with again another feature of the invention, the one input of the operational amplifier connected to the emitter contact of the ninth transistor is a non-inverting input, and the other input of the operational amplifier connected to the emitter contact of the tenth transistor is an inverting input.

In accordance with again a further feature of the invention, there are provided thirteenth, fourteenth, fifteenth and sixteenth transistors having emitter, collector and base contacts, the thirteenth and the fourteenth transistors being of the same type, the fifteenth and the sixteenth transistors being of a type complementary to the type of the thirteenth and the fourteenth transistors, the base contact of the thirteenth transistor forming the inverting input of the operational amplifier, the base contact of the fourteenth transistor forming the non-inverting input of the operational amplifier, the collector contacts of the thirteenth and the fourteenth transistors being connected to a potential, the emitter contact of the thirteenth transistor being connected to the emitter contact of the fifteenth transistor and the emitter contact of the fourteenth transistor being connected to the emitter contact of the sixteenth transistor, the base contacts of the fifteenth and the sixteenth transistors being connected to the collector contact of the fifteenth transistor, other constant current sources each being connected between a respective one of the collector contacts of the fifteenth and the sixteenth transistors and the reference potential, and the output of the operational amplifier connected to the output of the controller being the collector contact of the sixteenth transistor.

In accordance with again a further feature of the invention, there is provided a sixth resistor connected between the base contact of the tenth transistor and the base contact of the ninth transistor, and a third capacitor connected between the base contact of the tenth transistor and the reference potential.

In accordance with a concomitant feature of the invention, the potential connected to the collector contacts of the thirteenth and the fourteenth transistors is the fifth supply potential.

Other features which are considered as characteristic for the invention are set forth in the appended claims.

Although the invention is illustrated and described herein as embodied in a monolithically integrable, amplitude-controllable oscillator amplifier circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
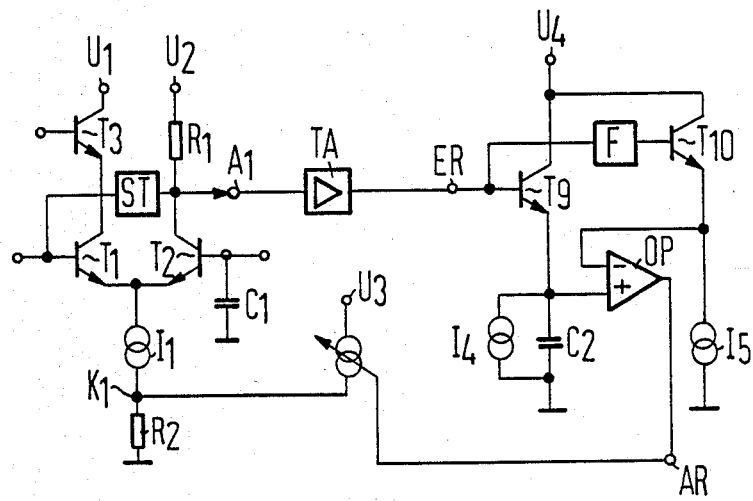
FIG. 1 is a basic schematic circuit diagram according to the invention.

Referring now to the figures of the drawing in detail and first, particularly, to FIG. 1 thereof, there is seen an oscillator amplifier constructed from a monolithically integrable differential amplifier circuit. In the FIG. 1 circuit, the collector of the first transistor $T_1$ is connected directly to the emitter of a third transistor $T_3$ forming a cascode circuit, and the collector of the third transistor $T_3$ is connected to a first potential $U_1$. The collector of the second transistor $T_2$ is provided as a first amplifier output $A_1$ and is connected through a first resistor $R_1$ to a second potential $U_2$. The emitters of the first transistor $T_1$ and of the second transistor $T_2$ are connected through a first current source to reference potential (ground). The first current source is formed of a series circuit of a second current source $I_1$ and a seventh constant current source. The first constant current source is in particular formed of a second resistor $R_2$ which is connected to the second current source $I_1$ through a first circuit node $K_1$. In the first current source, an amplitude control as a function of the output signal is provided for the oscillator amplifier. A first output $A_1$ of the oscillator amplifier is connected through a divided amplifier TA to a signal input ER of a controller. The base contact of a ninth transistor $T_9$ is connected to the signal input ER of the controller circuit and the base contact of a tenth transistor $T_{10}$ is also connected through a low-pass filter F to the signal input ER. The collector contacts of the ninth and tenth transistors are each connected to a potential, in particular a common fifth supply potential $U_4$. The emitter of the ninth transistor $T_9$ is connected to one input of an operational amplifier OP, in particular the non-inverting input. The emitter of the ninth transistor $T_9$ is also connected to reference potential (ground) through a second capacitor $C_2$ as well as through a first constant current source $I_4$. The emitter of the tenth transistor $T_{10}$ is connected to the other input of the operational amplifier OP, in particular the inverting input. Furthermore, the emitter of the tenth transistor $T_{10}$ is connected through a second constant current source $I_5$ to the reference potential (ground). The output of the operational amplifier is connected to an output AR of the controller. The ratio of the current of the second constant current source $I_5$ to the current of the first constant current source $I_4$ is provided for set-point adjustment. The final control element of the control circuit is formed of a first voltage-controlled current source. The control voltage input of the first voltagecontrolled current source is acted upon by a control variable furnished by a controller having a decoupled input ER. The current input of the first voltage-controlled current source is connected to a third potential $U_3$ and the current output thereof is connected to the first circuit node $K_1$, in the embodiment of FIG. 1. However, in the embodiment of FIG. 2, the second current source $I_1$ may particularly be formed of an eighth transistor $T_8$ operated in the basegrounded mode, wherein the emitter of the eighth transistor is connected to the second resistor $R_2$ through the first node $K_1$, the first node $K_1$ is interconnected with the current output of the first voltage-controlled current source, and the base contact of the eighth transistor is connected to a constant potential. In the base-grounded mode, a largely constant potential is established at the emitter contact of the eighth transistor by means of the constant base potential of this transistor, so that the second resistor, which is disposed between the emitter contact of the eighth transistor and the reference potential, carries a constant current. If the first node $K_1$ is supplied with a portion of this current through the first voltage-controlled current source as defined by the second resistor $R_2$, then the current flowing through the eighth transistor is reduced by this supplied current component.

The direct potentials required for establishing the operating points of the transistors are supplied to the various transistors in a known manner, for example by resistors.

An improvement in the control constancy and the elimination of the Miller effect, which arises in the vicinity of the transistor connected through the base to a frequency-determining circuit element ST, is made possible in accordance with the invention. This is due to the fact that the signal for ascertaining the input variable of a controller is picked up asymmetrically at only one collector of the oscillator differential amplifier. As a result, a DC offset between the two collectors of the differential amplifier pair in fact has no influence on the controller input, and furthermore the controller of the differential amplifier transistor not used for decoupling the controller input signal can be interconnected directly with the emitter of a second transistor, which is base-grounded, forming a cascode circuit.

A controller of the type according to the invention is advantageous in order to process an asymmetrical oscillator signal. The ninth transistor $T_9$ is operated at the operating point at which the rectification efficiency of the transistor is optimal, due to a suitable selection of the current of the first constant current source $I_4$.

In other words, as is normally true of oscillators, if a signal composed of alternating voltage components and a direct voltage component is fed to the signal input ER of the above-described controller, then this signal is applied directly to the base contact of the ninth transistor $T_9$, and consequently a direct voltage is present at the emitter of the ninth transistor $T_9$ that is composed of the one-way rectified components of all of the signal frequencies as well as the direct voltage component of the input signal. Only the part of the input signal having a frequency which is lower than the threshold frequency of the low-pass filter F is present at the base contact of the tenth transistor $T_{10}$. The higher-frequency components are damped. Therefore, there are also no components that originate from rectification of signals of higher frequencies present in the direct voltage applied to the emitter of the tenth transistor $T_{10}$. Thus, aside from a factor, the signal at the emitter of the ninth transistor only differs from the signal at the emitter of the tenth transistor by the rectified component of the input signal of the controller which has a frequency that is above the threshold frequency of the low-pass filter F. The direct voltage component of the input signal as well as the signal components having a frequency which is below the threshold frequency of the low-pass filter F, are taken into account in the same manner in the emitter output signals of the ninth and tenth transistors $T_9$, $T_{10}$. If the emitter output signal of the ninth transistor $T_9$ is fed to the non-inverting input of the operational amplifier OP and the emitter output signal of the tenth transistor $T_{10}$ is fed to the inverting input of the operational amplifier OP, then the output of the operational amplifier OP furnishes input signal components which are weighted with a factor and which have a frequency that is higher than the threshold frequency of the low-pass filter. The direct voltage component and the low-frequency disturbance components of the input signal of the circuit are not contained in this output signal, because of the high common-mode suppression of the operational amplifier OP. The factor with which the higher-frequency input signal components are weighted can be predetermined by the selection of the ratio between the current of the first constant current source $I_4$ and the current of the second constant current source $I_5$. The variation of this current ratio thus permits a set-point value setting to be made. No further direct voltage addition is required at one of the inputs of the operational amplifier.

The ratio of the currents of the first constant current source $I_4$ and the second constant current source $I_5$ to one another also defines the control direction. The control direction is reversed by exchanging the operational amplifier inputs with one another. A divider amplifier TA is provided for high-impedance coupling of the low-impedance controller input ER to the first oscillator amplifier input $A_1$.

Minimal signal transit times in the high-frequency portion of the circuit and a correspondingly larger bandwidth can be attained by an economy of parasitic capacitors in the vicinity of the base contacts of the differential amplifier transistors. In order to avoid an additional capacitive loading of the base contacts by the controller circuit, in accordance with the invention the controller does not act upon the base potential of the differential amplifier transistors but instead varies the output amplitude of the oscillator by controlling the differential amplifier current.

The input signal of the amplitude control circuit which is provided may be derived from an asymmetrical output signal of the oscillator differential amplifier. If this is the case then the additional noise of the control loop is not compensated for in the differential amplifier pair of the oscillator amplifier as is done, for instance, in circuits constructed in accordance with German Patent DE-PS 30 41 392. Instead it appears in the form of a disturbance at a first output of the oscillator amplifier.

The effect of noise of the control loop on the oscillator output signal can be minimized, however, by means of a fourth capacitor of suitable size, which connects the control input of the voltage-controlled current source which is provided as a final control element, with the reference potential (ground).

A further suppression of the additional noise power component of the oscillator output signal resulting from the control loop is attained by constructing the voltagecontrolled current source serving as the final control element in the form of transistor circuits having pronounced negative feedback of current. In this way, the unsuppressed remaining portion of the additional noise of the control loop at the control input of this voltage-controlled current source is present with the lowest possible gain, in particular less than 1, at the output of the oscillator amplifier. A correspondingly low gain can be attained by providing that the resultant internal resistance of the second voltagecontrolled current source $I_2$ is not less than the resistance of the load resistor of the oscillator amplifier circuit connected to the collector of the second transistor.

However, a high internal resistance of the controllable current source disposed between the emitters of the oscillator differential amplifier transistor pair and the reference potential limits the maximally occurring voltage through the transistors and thus impedes the minimization of the transistor depletion layer capacitance. A conventional voltage-controlled current source is therefore relatively unsuitable as a final control element for minimizing the additional noise of the control loop.

The output amplitude of the oscillator differential amplifier circuit can be varied as a function of the controller output variable. This is done by providing that the emitter contacts of the oscillator differential amplifier transistors are connected through a seventh current source with the current input of a constant current source, and the current output of a further voltage-controlled current source is likewise connected to the current input of this seventh constant current source. The sum of the emitter currents is the product of the difference of the current of the seventh constant current source and the current of the voltage-controlled current source. The emitter currents are varied as a function of the current of the voltage-controlled current source, which serves as a final control element and the control input of which is triggered by the controller output.

Figure 2:
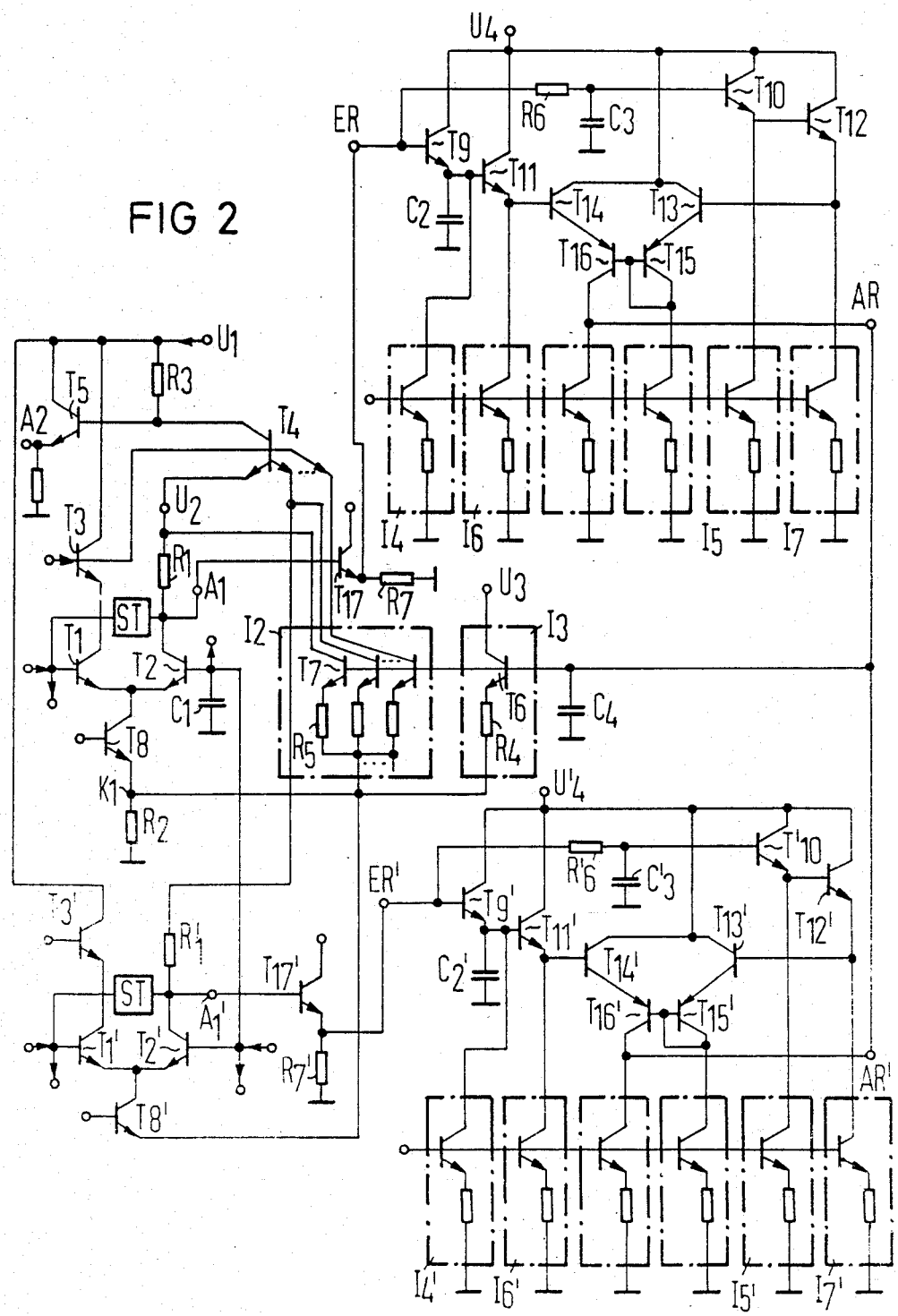
FIG. 2 is a schematic circuit diagram of a particularly favorable embodiment of the invention.

In accordance with the invention as shown in FIG. 2, the above-described semiconductor oscillator amplifier circuit in which the contact pins of the third amplifier output $A_2$ and of the high point of the frequency-determining circuit element can be disposed arbitrarily, including a diposition in which they are beside one another, avoids the occurrence of disturbing interference between signals of these two contacts. Furthermore, in accordance with FIG. 2, the first voltage-controlled current source is constructed as a parallel circuit of a second voltage-controlled current source $I_2$ and a third voltage-controlled current source $I_3$. The control inputs and the current outputs of the second and third voltage-controlled current sources $I_2$, $I_3$ are interconnected. The current input of the third voltage-controlled current source $I_3$ is connected to the third potential $U_3$, the current input of the second voltage-controlled current source $I_2$ is connected to the first resistor $R_1$ which is connected to the second potential $U_2$. The current of the second voltage-controlled current source $I_2$ is of the same magnitude as the current of the third voltagecontrolled current source $I_3$. A fourth potential, which in particular may be identical to the first potential $U_1$, is connected through a third resistor $R_3$ to the collector contact of a fourth transistor $T_4$ and to the base contact of a fifth transistor $T_5$. The base contact of the fourth transistor $T_4$ is in particular interconnected to the base contact of the third transistor $T_3$. The collector of the fifth transistor $T_5$ is connected to the fourth potential. The emitter contact of the fifth transistor $T_5$ forms a second amplifier output $A_2$, which is connected through a current source, in particular a resistor, to the reference potential (ground). The emitter contact of the fourth transistor $T_4$ is provided with the second potential $U_2$, for action upon the first resistor $R_1$ and the current input of the second voltage-controlled current source $I_2$. The output signals of the first and second amplifier outputs $A_1$, $A_2$ are largely phase-coincident.

As shown in FIG. 2, a plurality of oscillators with their corresponding oscillator amplifiers may provided in a circuit, especially for expanding the bandwidth, in such a manner that only one of the oscillators at a time is in operation. In such a case the oscillator amplifier circuits constructed in accordance with the above-described subject of the invention may only have one each of the following elements: the operating point direct voltage supply of the second transistor $T_2$, a first capacitor $C_1$, the second resistor $R_2$, the second voltage-controlled current source, the fourth transistor $T_4$, the fifth transistor $T_5$ including its above-described wiring, and the fourth capacitor $C_4$.

FIG. 2 shows a circuit layout having two oscillators to be driven in alternation. The drawing indicates that the number of oscillators that can be connected may also be greater for the current source $I_2$ and the transistor $T_4$. The circuit elements that are separately required for each oscillator that is used and that perform the same function, are provided with identical reference numerals. For the sake of better distinguishing among them, the reference numerals for the elements of the second oscillator are each provided with a prime.

FIG. 2 shows a further favorable embodiment of the controller circuit described above, which differs from the circuit of FIG. 1 in that the emitter contact of the ninth transistor $T_9$ is not directly connected to one input of the operational amplifier OP, but instead it is connected to the base contact of an eleventh transistor $T_{11}$, in order to form a Darlington stage. The emitter contact of this eleventh transistor $T_{11}$ is connected to one input of the operational amplifier OP and through a third constant current source $I_6$ to the reference potential. The emitter contact of the tenth transistor $T_{10}$ is not directly connected to the other input of the operational amplifier OP but instead it is connected to the base contact of a twelfth transistor $T_{12}$, in order to form a Darlington stage. The emitter contact of the twelfth transistor $T_{12}$ is connected to the other input of the operational amplifier OP and through a fourth constant current source $I_7$ to the reference potential. The collector of the eleventh transistor $T_{11}$ and the collector of the twelfth transistor $T_{12}$ are each connected to a potential, in particular the fifth supply potential $U_4$. The base contact of a thirteenth transistor $T_{13}$ and the base contact of a fourteenth transistor $T_{14}$ of the same type are respectively provided as the inverting input of the operational amplifier OP and as the non-inverting input of the operational amplifier OP. The collector contact of the thirteenth transistor and the collector contact of the fourteenth transistor are connected to a potential, in particular the fifth supply potential $U_4$. The emitter of the thirteenth transistor $T_{13}$ is connected to the emitter of a fifteenth transistor $T_{15}$ and the emitter of the fourteenth transistor $T_{14}$ is connected to the emitter of a sixteenth transistor $T_{16}$. The type of the fifteenth and sixteenth transistors $T_{15}$, $T_{16}$ are complementary to the type of the thirteenth and fourteenth transistor $T_{13}$, $T_{14}$. The base of the fifteenth transistor $T_{15}$ and the base of the sixteenth transistor $T_{16}$ are connected to the collector of the fifteenth transistor $T_{15}$. The collectors of the fifteenth and sixteenth transistors $T_{15}$, $T_{16}$ are each connected through a respective constant current source to reference potential and the collector of the sixteenth transistor $T_{16}$ is provided as the output of the operational amplifier OP. The base contact of the tenth transistor $T_{10}$ is connected through a sixth resistor $R_6$ to the base contact of the ninth transistor $T_9$ and through a third capacitor $C_3$ to the reference potential. The controller input in FIG. 2 is decoupled from the first amplifier output $A_1$ by means of a seventeenth transistor $T_{17}$ which is operated in the collector mode, in such a manner that the base of the seventeenth transistor $T_{17}$ is connected to the first oscillator amplifier output $A_1$, the collector of the seventeenth transistor $T_{17}$ is connected to a first supply potential, and the emitter of the seventeenth transistor $T_{17}$ is connected through the seventh resistor $R_7$ to the reference potential (ground) and is connected directly to the controller input ER.

In addition to the output to the amplitude controller and the output to the mixer which typically carries a symmetrical signal, in oscillator circuits, especially for use as mixer oscillators, a further, third signal output is often necessary on the oscillator amplifier. The third signal output is provided for connection to peripheral circuit assemblies, particularly to a counter. In order to avoid interference between the signal at this third signal output $A_2$ and the signal that arises at the high point of a frequency-determining circuit element ST, the corresponding contact pins of the integrated circuit must be spaced apart as far as possible from one another, but at least a firmly defined reference potential must be specified between the contact pins. These provisions are unnecessary only if it is assured that the output signal at the third signal output $A_2$ is largely in phase with the signal at the high point of the frequency-determining circuit element ST at every instant.

Phase coincidence between the connection of the frequency-determining circuit element ST and the third signal output is attained by providing that the applicable output signal is in phase with the applicable input signal, for all of the elements of the decoupling circuit between the connection of the frequency-determining circuit element ST and the third output.

Both ohmic resistors and base or collector-grounded transistors are known examples of such elements, and a constant current should, on average, flow in the transistors.

As seen in FIG. 2, the collector current of the fourth transistor $T_4$ is substantially composed of the collector current of the second transistor $T_2$ and the current of the second voltage-controlled current source $I_2$. The constant current through the second resistor $R_2$ is composed of the sum of the oscillator amplifier currents, the current of the second and the current of the third voltage-controlled current sources $I_2$, $I_3$. The currents in the two branches of the oscillator differential amplifier $T_1$, $T_2$ as well as the currents in the second and third voltage-controlled current sources $I_2$, $I_3$ may in each case be of virtually identical magnitude. In such a case, the current in the fourth transistor $T_4$ remains virtually constant, even though the voltage-controlled current sources $I_2$, $I_3$ serving as final control elements, do vary the currents of the first and second transistors $T_1$, $T_2$ upon variation of the control voltage at the control inputs. Since the fourth transistor $T_4$ is used in the base-grounded mode and the fifth transistor $T_5$ is used in the collector-grounded mode, no notable phase displacement occurs between the input and the output thereof.

In semiconductor circuits to be monolithically integrated, the chip surface area and the number of contacts leading to the outside should be minimized. If a plurality of similar components are united on one chip and connected together, then it becomes advantageous to provide such circuit elements required in each component only once and to wire all of the components together in a group. In this case a particular advantage is the economy in terms of internal capacitors, because they require a relatively large chip surface area, and the economy in external circuit means, because these must each be bonded separately to the outside.

In terms of direct voltage, in controller circuits according to FIG. 1, the potentials at the inputs of the operational amplifier only differ from the potential at the signal input of the control circuit by the voltage applied through a base-to-emitter path. The control range of the controller, which is affected by the ratio of the current of the ninth transistor $T_9$ to the current of the tenth transistor $T_{10}$, is limited because of this slight potential difference, since a slight increase in the voltage difference leads to a relatively great increase of the current difference, yet an excessively great current difference prevents exact setting of the circuit, because of the logarithmic dependency of the current on the voltage. Due to the above-described series connection of the ninth and eleventh transistors $T_9$, $T_{11}$ and of the tenth and twelfth transistors $T_{10}$, $T_{12}$, two base-to-emitter paths are each located between the signal input of the controller and the operational amplifier inputs. In order to attain the same voltage difference, a considerably lesser current difference is therefore necessary between the currents of the Darlington stages $T_9$, $T_{11}$ and $T_{10}$, $T_{12}$ in the circuits of FIG. 2 than between the currents of the ninth transistor $T_9$ and the tenth transistor $T_{10}$ in the circuit of FIG. 1. In circuits according to FIG. 2, the set-point value is determined not only by the ratio of the current of the first constant current source $I_4$ to the current of the second constant current source $I_5$, but also by the ratio of the ratio of the current of the third current source $I_6$ to the current of the first current source $I_4$ to the ratio of the current of the fourth current source $I_7$ to the current of the second current source $I_5$. In particular, as shown in FIG. 2, each of the constant current sources may be constructed as a base-grounded transistor having an emitter which is connected through a resistor to the reference potential, a base which is acted upon by a constant potential and a collector which is provided as a current input. With a constant base potential, the current of the current source in this case is defined by the resistor. If all of the current sources are formed in this way and the base contacts of all of the current source transistors are applied to the same reference potential, then the entire circuit can be made currentless as needed, by varying the reference potential.

As shown in FIG. 2, the first voltage-controlled current source may in particular be formed of a semiconductor circuit as described below. In such a circuit, the third voltage-controlled current source $I_3$ is formed by a sixth transistor $T_6$, the emitter contact of which is connected through a fourth resistor $R_4$ to the current output of the third voltage-controlled current source $I_3$. The second voltage-controlled current source $I_2$ has at least a seventh transistor $T_7$ and a further transistor for each additional oscillator. The emitter connection of the seventh transistor $T_7$ is connected through a fifth resistor $R_5$ and the emitter contacts of the further transistors forming the second voltage-controlled current source are each connected through a further resistor to the current output of the second and third voltage-controlled current sources $I_2$, $I_3$. The base contacts of the transistors $T_6$, $T_7$, . . . forming the second and third voltage-controlled current sources $I_2$, $I_3$ are connected directly to the control inputs of the second and third voltage-controlled current source $I_2$, $I_3$. The collector contact of the sixth transistor $T_6$ forms the current input of the third voltage-controlled current source $I_3$ which is connected to the third potential $U_3$. The collector contacts of the transistors $T_7$, . . . forming the second voltage-controlled current source $I_2$ respectively form the current input of the second voltage-controlled current source $I_2$ connected to the emitter contact of the fourth transistor $T_4$. The fourth transistor has a separate emitter, in particular for each collector contact of the second voltage-controlled current source $I_2$. The current of the second and of the third voltage-controlled current sources $I_2$, $I_3$ are each of the same magnitude. Finally both the fourth resistor $R_4$ and the resistance value resulting from the parallel circuit of the fifth resistor $R_5$ and the possible further resistors contained in the second voltage-controlled current source $I_2$, are each greater than the first resistor $R_1$.

The operational amplifier in FIG. 2 is formed by a differential amplifier circuit that can be constructed in a spacesaving manner, by having a current mirror and fifth and sixth constant current sources.

If the threshold frequency of the low-pass filter can be selected to be sufficiently low in comparison with the signal frequency of the control variable, it is sufficient in some cases to provide the low-pass filter F as a first-order filter, which has a resistor between the input and output thereof and which has an output that is connected through a capacitor to the reference potential.

The wiring of the individual current sources is arbitrarily selectable. With suitable wiring, both bipolar n-p-n or p-n-p transistors and field effect transistors can be used as the transistors.

The foregoing is a description corresponding in substance to German Application P 37 23 751.9, dated July 17, 1987, the International priority of which is being claimed for the instant application, and which is hereby made part of this application. Any material discrepancies between the foregoing specification and the aforementioned corresponding German application are to be resolved in favor of the latter.

I claim:

1. Monolithically integrable amplitude-controllable oscillator amplifier circuit, comprising a differential amplifier including first, second and third transistors each having an emitter contact, a collector contact and a base contact; said emitter contacts of first and said second transistors being interconnected, a frequency-determining circuit element connected to said base contact of said first transistor, said base contacts of said first, said second and said third transistors being acted upon by a direct voltage, a first capacitor connecting said base contact of said second transistor to a reference potential, said frequency-determining circuit element being connected to said collector contact of said second transistor, said frequency-determining circuit element being connected to the oscillator amplifier, said collector contact of said first transistor being connected directly to said emitter contact of said third transistor forming a cascode circuit, said collector contact of said third transistor being connected to a first potential, said collector contact of said second transistor forming a first amplifier output providing a first output signal, a first resistor connected between said collector contact of said second transistor and a second potential; a first current source connected between said interconnected emitter contacts of said first and said second transistors and the reference potential, said first current source being formed of a series circuit of a second current source, a seventh constant current source and a circuit node connected between said second current source and said seventh constant current source; a control circuit for the oscillator amplifier controlling amplitude as a function of the output signal, said control circuit including a signal input, a control element having a first voltage-controlled current source with a control voltage input, a current input and a current output; a controller providing an actual-value detection by rectification, an input signal mean-value suppression with a differential amplifier, and a set-point setting, said controller feeding a control variable to said control voltage input of said first voltage-controlled current source, said current input of said first voltage-controlled current source being connected to a third potential, and said current output of said first voltage-controlled current source being connected to said first circuit node; ninth and tenth transistors each having an emitter contact, a collector contact and a base contact, an operational amplifier having two inputs and an output, said signal input of said controller circuit being connected to the base contact of said ninth transistor, a low-pass filter connected to the base contact of said tenth transistor and to said signal input, the collector contacts of said ninth and tenth transistors being connected to a potential, the emitter contact of said ninth transistor being connected to one of said inputs of said operational amplifier, a second capacitor connected between the emitter contact of said ninth transistor and reference potential, a first constant current source connected between the emitter contact of said ninth transistor and reference potential, the emitter contact of said tenth transistor being connected to the other of said inputs of said operational amplifier, a second constant current source connected between the emitter contact of said tenth transistor and the reference potential, and an output of said controller connected to said output of said operational amplifier, whereby the ratio of the current of said second constant current source to the current of said first constant current source provides set-point setting.

2. Circuit according to claim 1, wherein the reference potential is ground.

3. Circuit according to claim 1, including capacitors connected between said frequency-determining circuit element and the oscillator amplifier.

4. Circuit according to claim 1, wherein said seventh constant current source is a second resistor.

5. Circuit according to claim 1, wherein said second current source is an eighth transistor having emitter, collector and base contacts, said collector contact of said eighth transistor is interconnected with said interconnected emitter contacts of said first and said second transistors, said emitter contact of said eighth transistor is connected to said first node, and said base contact of said eighth transistor is acted upon by the reference potential.

6. Circuit according to claim 1, including fourth and fifth transistors each having emitter, collector and base contacts, said first voltage-controlled current current source being in the form of a parallel circuit of a second voltagecontrolled current source and a third voltage-controlled current source each having a control input, a current output, a current input and the same current magnitude, said control inputs and said current outputs of said second and third voltage-controlled current sources being interconnected; said current input of said third voltage-controlled current source being connected to the third potential; said current input of said second voltage-controlled current source being connected to said first resistor; a third resistor connecting said collector contact of said fourth transistor and said base contact of said fifth transistor to a fourth potential; said collector contact of said fifth transistor being connected to the fourth potential; said emitter contact of said fifth transistor forming a second amplifier output providing a second output signal being largely phase-coincident with the first signal output, another current source connected between said emitter contact of said fifth transistor and the reference potential; and said emitter contact of said fourth transistor being connected to the second potential.

7. Circuit according to claim 6, wherein said fourth potential is identical to said first potential.

8. Circuit according to claim 6, wherein said base contact of said fourth transistor is connected to said base contact of said third transistor.

9. Circuit according to claim 6, wherein said current source connected between said emitter contact of said fifth transistor and the reference potential connected is a resistor.

10. Circuit according to claim 6, including a fourth capacitor connecting said control input of said first voltage-controlled current source to the reference potential.

11. Circuit according to claim 10, wherein said first constant current source is a second resistor, and including at least one other oscillator amplifier being identical to said first-mentioned oscillator amplifier, all of said oscillator amplifiers having one common operating point and direct voltage supply for said second transistors, said first capacitors, said second resistors, said first voltage-controlled current sources, said fourth capacitors, said fourth transistors and said fifth transistor, including the connections therefor.

12. Circuit according to claim 6, wherein said third voltage-controlled current source includes a sixth transistor having emitter, collector and base contacts and a fourth resistor connecting the emitter contact of said sixth transistor to said current output of said third voltage-controlled current source; said second voltage-controlled current source including at least a seventh transistor having emitter, collector and base contacts and at least one fifth resistor connecting the emitter contact of said at least one seventh transistor to said current outputs of said second and third voltage-controlled current sources; the base contacts of said sixth and said at least one seventh transistors are connected directly to said control inputs of said second and third voltage-controlled current sources; the collector contact of said sixth transistor forms said current input of said third voltage-controlled current source and is connected to said third potential; the collector contact of said at least one seventh transistor respectively forms said current input of said second voltage-controlled current source and is connected to said emitter contact of said fourth transistor, and said fourth transistor has a separate emitter contact connected to each collector contact of said at least one seventh transistor.

13. Circuit according to claim 6, wherein said second and said third voltage-controlled current sources have currents of the same magnitude.

14. Circuit according to claim 12, wherein each of said fourth resistor and said at least one fifth resistor have resistance values each being greater than the resistance value of said first resistor.

15. Circuit according to claim 1, including third and fourth constant current sources, an eleventh transistor having emitter, collector and base contacts and being connected between said ninth transistor and said one input of said operational amplifier forming a Darlington stage, the emitter contact of ninth transistor being connected to the base contact of said eleventh transistor, the emitter contact of said eleventh transistor being connected to said one input of said operational amplifier and through said third constant current source to the reference potential; a twelfth transistor having emitter, collector and base contacts and being connected between said tenth transistor and said other input of said operational amplifier forming another Darlington stage, the emitter contact of said tenth transistor being connected to the base contact of said twelfth transistor, the emitter contact of said twelfth transistor being connected to said other input of said operational amplifier and through said fourth constant current source to the reference potential, the collector contacts of said eleventh and said twelfth transistors each being connected to a potential; whereby in addition to the ratio of the current of said first constant current source to the current of said second constant current source, the ratio of the ratios of the current of said third constant current source to the current of said first constant current source to the ratio of the current of said fourth constant current source to the current of said second constant current source provide the set-point value setting.

16. Circuit according to claim 1, wherein the potential connected to said collector contacts of said ninth and tenth transistors is a common fifth supply potential.

17. Circuit according to claim 16, wherein said one input of said operational amplifier connected to said emitter contact of said ninth transistor is a non-inverting input, and said other input of said operational amplifier connected to the emitter contact of said tenth transistor is an inverting input.

18. Circuit according to claim 17, including thirteenth, fourteenth, fifteenth and sixteenth transistors having emitter, collector and base contacts, said thirteenth and said fourteenth transistors being of the same type, said fifteenth and said sixteenth transistors being of a type complementary to the type of said thirteenth and said fourteenth transistors, the base contact of said thirteenth transistor forming said inverting input of said operational amplifier, the base contact of said fourteenth transistor forming said non-inverting input of said operational amplifier, the collector contacts of said thirteenth and said fourteenth transistors being connected to a potential, the emitter contact of said thirteenth transistor being connected to the emitter contact of said fifteenth transistor and the emitter contact of said fourteenth transistor being connected to the emitter contact of said sixteenth transistor, the base contacts of said fifteenth and said sixteenth transistors being connected to the collector contact of said fifteenth transistor, other constant current sources each being connected between a respective one of the collector contacts of said fifteenth and said sixteenth transistors and the reference potential, and said output of said operational amplifier connected to said output of the controller being the collector contact of said sixteenth transistor.

19. Circuit according to claim 15, including a sixth resistor connected between the base contact of said tenth transistor and the base contact of said ninth transistor, and a third capacitor connected between the base contact of said tenth transistor and the reference potential.

20. Circuit according to claim 18, wherein the potential connected to the collector contacts of said thirteenth and said fourteenth transistors is said fifth supply potential.

* * * * *